United States Patent
Park et al.

(10) Patent No.: US 8,500,506 B2
(45) Date of Patent: Aug. 6, 2013

(54) SEALING APPARATUS AND METHOD OF MANUFACTURING FLAT DISPLAY DEVICE USING THE SAME

(75) Inventors: Jin-Han Park, Yongin (KR); Hyung-Sik Kim, Yongin (KR); Joon-Hyung Kim, Yongin (KR); Seung-Ho Myoung, Yongin (KR); Jong-Dae Kim, Yongin (KR); Cheol Lae Roh, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 722 days.

(21) Appl. No.: 12/646,130

(22) Filed: Dec. 23, 2009

(65) Prior Publication Data
US 2010/0267307 A1    Oct. 21, 2010

(30) Foreign Application Priority Data
Apr. 16, 2009  (KR) .................. 10-2009-0033189

(51) Int. Cl.
*H01J 9/26*    (2006.01)
(52) U.S. Cl.
USPC ............................... 445/25; 313/512; 445/24
(58) Field of Classification Search
USPC ...................................... 445/25, 24; 313/512
See application file for complete search history.

(56) References Cited

U.S. PATENT DOCUMENTS
4,468,260 A * 8/1984 Hiramoto .................. 438/558

FOREIGN PATENT DOCUMENTS
| JP | 2005-099783 | 4/2005 |
| JP | 2006-030543 | 2/2006 |
| KR | 1020070083149 A | 8/2007 |

OTHER PUBLICATIONS

English Translation of JP2006-030543, published Feb. 2, 2006.*
English Translation of KR1020070083149, published Aug. 23, 2007.*
The Japanese Office Action issued on Jul. 3, 2012 in the corresponding Japanese Patent Application No. 2010-075369.
Korean Office Action issued by KIPO, dated Nov. 16, 2010, corresponding to Korean Patent Application No. 10-2009-0033189, together with Request for Entry.

* cited by examiner

*Primary Examiner* — Mary Ellen Bowman
(74) *Attorney, Agent, or Firm* — Robert E. Bushnell, Esq.

(57) ABSTRACT

A sealing apparatus and a method of manufacturing a flat display device using the sealing apparatus. The sealing apparatus to attach a first substrate and a second substrate to each other using an attachment member disposed between the first and second substrates, the sealing apparatus comprises a stage on which the first substrate is seated, a halogen lamp irradiating light, and a reflector reflecting light irradiated from the halogen lamp to the attachment member.

8 Claims, 5 Drawing Sheets

SEALING APPARATUS AND METHOD OF MANUFACTURING FLAT DISPLAY DEVICE USING THE SAME

CROSS-REFERENCE TO RELATED APPLICATION

This application claims the benefit of Korean Application No. 10-2009-0033189, filed Apr. 16, 2009 in the Korean Intellectual Property Office, the disclosure of which is incorporated herein by reference.

BACKGROUND OF THE INVENTION

1. Field of the Invention

Aspects of the present invention relate to a sealing apparatus and a method of manufacturing a flat display device using the sealing apparatus.

2. Description of the Related Art

Display devices are increasingly being replaced by slim, portable flat panel display devices. Electroluminescent display devices, among the flat panel display devices, are self luminescent display devices, and have advantages of a wide angle of view, a high contrast level, and a fast response speed. Therefore, the electroluminescent display devices are being pursued as a display device of the next generation.

Organic light-emitting display devices having a light-emitting layer composed of an organic material have characteristics of brightness, a lower driving voltage, and a higher response speed and are capable of displaying more colors than inorganic light-emitting display devices. Generally, an organic light-emitting display device has a structure in which at least one organic layer including an emission layer is interposed between a pair of electrodes (that is, a first electrode and a second electrode). The first electrode is formed on a substrate, and functions as an anode that injects holes. An organic layer is formed on the first electrode. The second electrode functions as a cathode that injects electrons, and is formed on the organic layer so as to face the first electrode.

When moisture or oxygen flows into elements of such an organic light-emitting display device from the surroundings, there are problems due to oxidation of an electrode material. Examples of such problems are exfoliation of an electrode surface or the like. These problems shorten the life of the elements, lower a light-emitting efficiency, and deteriorate emitted light colors. Therefore, in the manufacture of the organic light-emitting display device, a sealing process is usually performed so that the elements can be isolated from outside exposure and moisture infiltration into the elements. In the sealing process, usually a polymer organic material (such as polyethylene terephthalate (PET)) that is a thermoplastic polyester, is laminated on the second electrode or a cover or a cap is formed on the second electrode. Nitrogen gas is filled in the cover or the cap, and the rim of the cover or the cap is capsule-sealed by a sealant such as epoxy. The cover or the cap may be made of a metallic material or a glass material that is moisture absorbent.

However, such methods can allow for some element damaging materials such as moisture, oxygen, or the like to infiltrate into the device from the outside. In addition, the methods are not well suited when applied to top-emitted organic light-emitting display device having elements that are specifically weak to moisture, and a process to realize the methods is complicated. In order to solve the above mentioned problems, a capsule sealing method is used to enhance adhesion between an element substrate and a cap using a frit as a sealant.

The method of capsule-sealing an organic light-emitting display device includes coating a frit on a glass substrate which perfectly seals the element substrate and the cap together. Thus, the organic light-emitting display device can be protected from being infiltrated with the element damaging material more effectively than an organic light-emitting display device using epoxy as a sealant.

In the method of capsule-sealing the organic light-emitting display device with the frit, after the frit is coated on each sealing portion of the organic light-emitting display device, a laser irradiating apparatus is moved to the sealing portions thereof and irradiates a laser beam to the sealing portions to harden the frit for sealing.

SUMMARY OF THE INVENTION

Aspects of the present invention provide a sealing apparatus capable of minimizing stress occurring during the attaching of a first substrate and a second substrate, and therefore minimizing crack defects at a cutting surface.

Aspects of the present invention also provide a method of manufacturing a flat display device using the sealing apparatus.

According to an aspect of the present invention, there is provided a sealing apparatus that attaches a first substrate and a second substrate to each other using an attachment member disposed between the first and second substrates, the sealing apparatus including: a stage on which the first substrate is seated; a halogen lamp irradiating light; and a reflector reflecting light irradiated from the halogen lamp to the attachment member.

According to aspects of the present invention, the halogen lamp may irradiate light to a whole section area of the first substrate and the second substrate in one direction of the first substrate.

According to aspects of the present invention, the one direction of the first substrate may be a lengthwise direction of a side of the first substrate.

According to aspects of the present invention, the halogen lamp may irradiate light to the attachment member while moving in a direction crossing the one direction of the first substrate.

According to aspects of the present invention, the halogen lamp may irradiate light to the attachment member while moving in a direction perpendicular to the one direction of the first substrate.

According to aspects of the present invention, the halogen lamp may have the same length as that of one direction of the first substrate.

According to aspects of the present invention, the halogen lamp may have a length longer than that of one direction of the first substrate.

According to aspects of the present invention, the output of the halogen lamp may be about 2 to about 10 KW.

According to aspects of the present invention, the reflector may be formed with the same length as or a length longer than that of the halogen lamp.

According to aspects of the present invention, the reflector may be formed with a concave shape with respect to the halogen lamp, may reflect the light irradiated from the halogen lamp, and may converge the light to the attachment member.

According to aspects of the present invention, the sealing apparatus may further include a light-blocking member disposed on the second substrate, allowing light irradiated from the halogen lamp to pass therethrough to the attachment member, and not allowing light to pass therethrough to areas not coated with the attachment member.

According to aspects of the present invention, the light-blocking member may be disposed spaced apart from the second substrate.

According to aspects of the present invention, the sealing apparatus may further include a reflecting plate disposed between the first substrate and the stage.

According to aspects of the present invention, the first substrate may include a plurality of cells having respective organic light-emitting units, the second substrate may be disposed on the first substrate to seal the cells, and the attachment member may be coated between the first substrate and the second substrate to surround each of the cells.

According to aspects of the present invention, the halogen lamp may irradiate light a whole section area of the first substrate and the second substrate in one direction along which the cells are arrayed.

According to aspects of the present invention, the halogen lamp may irradiate light to the attachment member while moving in a direction crossing the one direction.

According to aspects of the present invention, the halogen lamp may irradiate light to the attachment member while moving in a direction perpendicular to the one direction.

According to aspects of the present invention, the attachment member may be composed of a frit material.

According to an aspect of the present invention, there is provided a method of manufacturing a flat display device using a sealing apparatus that attaches a first substrate and a second substrate with an attachment member and has a halogen lamp, the method including: disposing the attachment member between the first substrate and the second substrate; attaching the first substrate and the second substrate to each other; seating the first substrate and the second substrate that are attached to each other on a stage of the sealing apparatus; converging the light irradiated from the halogen lamp and irradiating the light to the attachment member in a manner that the light is irradiated to the attachment member in a whole section area of the first substrate and the second substrate in one direction of the first substrate at the same time; irradiating light to the attachment member while moving the halogen lamp in a direction crossing the one direction; and hardening the attachment member melted by the irradiated light to attach the first substrate and the second substrate to each other.

In the converging the light irradiated from the halogen lamp and the irradiating the light to the attachment member, the light may be reflected and converged by a reflector, and may be irradiated to the attachment member according to aspects of the present invention.

In the converging the light irradiated from the halogen lamp and irradiating the light to the attachment member, the one direction of the first substrate may be a lengthwise direction of a side of the first substrate according to aspects of the present invention.

The irradiating light to the attachment member while moving the halogen lamp in a direction crossing the one direction may be replaced by irradiating light to the attachment member while moving the halogen lamp in a direction perpendicular to the one direction according to aspects of the present invention.

According to aspects of the present invention, the attachment member may be composed of a frit material.

According to aspects of the present invention, the method may further include disposing a light-blocking member on the second substrate, the light-blocking member allowing light irradiated from the halogen lamp to pass therethrough to the attachment member, and not allowing light to pass therethrough to areas not coated with the attachment member, between the seating the first substrate and the second substrate that are attached to each other on a stage of the sealing apparatus and the converging the light irradiated from the halogen lamp and irradiating the light to the attachment member.

According to aspects of the present invention, the light-blocking member may be disposed spaced apart from the second substrate.

According to aspects of the present invention, the output of the halogen lamp may be about 2 to about 10 KW.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
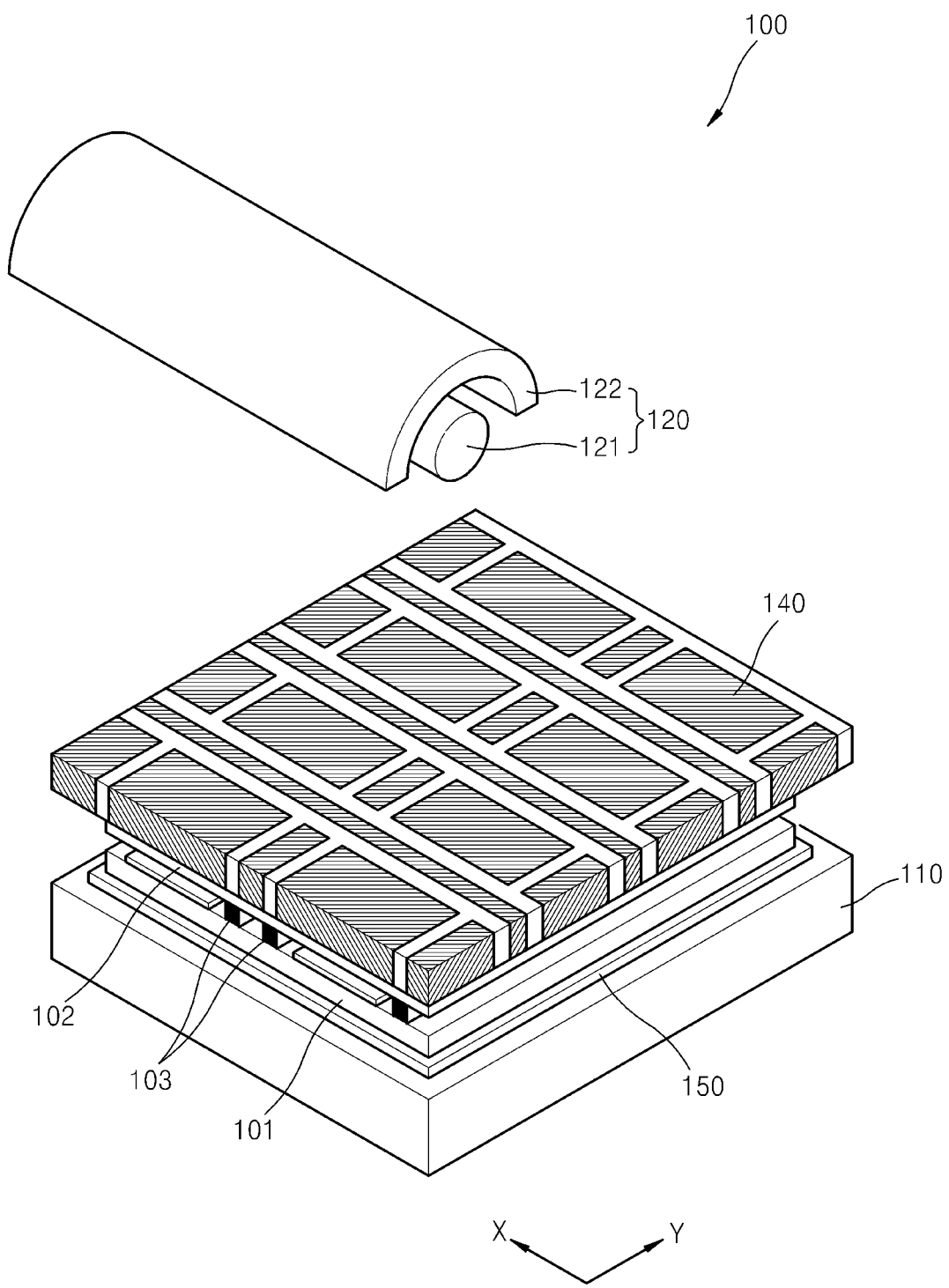
FIG. 1 is a perspective view schematically illustrating a sealing apparatus according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2:
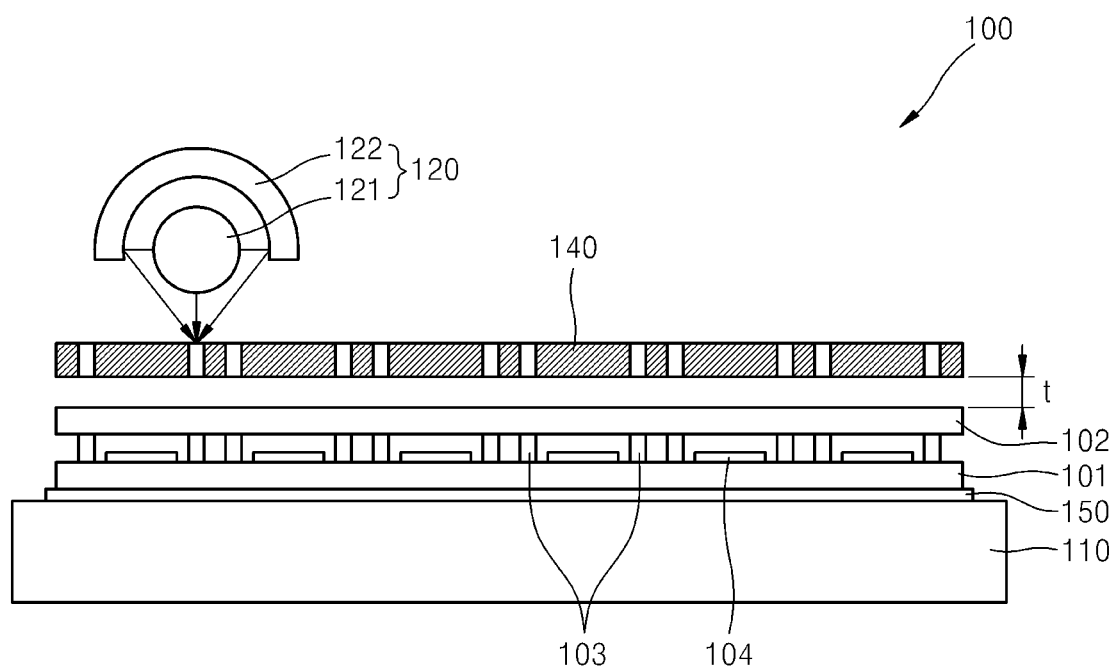
FIG. 2 is a cross-section view schematically illustrating the sealing apparatus of FIG. 1.

FIG. 1 is a perspective view schematically illustrating a sealing apparatus 100 according to an embodiment of the present invention, and FIG. 2 is a section view schematically illustrating the sealing apparatus 100 of FIG. 1. Referring to FIGS. 1 and 2, the shown sealing apparatus 100 includes a stage 110, a light-irradiating unit 120, a light-blocking member 140, and a reflecting plate 150.

A first substrate 101 and a second substrate 102 are seated on the stage 110. The stage 110 affixes the first substrate 101 and the second substrate 102 while the light-irradiating unit 120 irradiates light. In addition, an attachment member 103 is coated between the first substrate 101 and the second substrate 102.

The light-irradiating unit 120 irradiates light to the attachment member 103 between the first substrate 101 and the second substrate 102 to melt the attachment member 103 so as to attach the first substrate 101 and the second substrate 102. The shown light-irradiating unit 120 includes a halogen lamp 121 and a reflector 122. While described in terms of a halogen lamp, it is understood that the light can be from any source, and can be a laser or multiple laser beams focused in a line along the substrates 101, 102. The light-irradiating unit 120 may be supported by a guide (not shown) to move above the first substrate 101 and the second substrate 102.

While the halogen lamp 121 moves along the guide (not shown), the halogen lamp 121 irradiates light to the attachment member 103 from above the second substrate 102. The halogen lamp 121 may irradiate light to a whole section area lying in one direction on the first substrate 101 and the second substrate 102. In detail, as shown in FIG. 1, the halogen lamp 121 may irradiate light to a whole section area of the first substrate 101 and the second substrate 102 in a transversal direction X at the same time. However, the halogen lamp 121 is not limited to irradiating light in the transversal direction, and the halogen lamp 121 may irradiate light to a whole section area of the first substrate 101 and the second substrate 102 in any one direction on the first substrate 101 and the second substrate 102, namely, in a longitudinal direction Y or a diagonal direction of the first substrate 101 and the second substrate 102, or other similar non-transversal directions. The halogen lamp 121 may have the shape of a column having a predetermined length, or the halogen lamp 121 may have a cylindrical shape as shown in FIG. 1, or other similar shapes. The cross-section area of the halogen lamp 121 may have a polygonal shape instead of a circular shape, however, aspects of the present invention are not limited thereto.

The halogen lamp 121 may have a sufficient length to irradiate light to a whole section area of the first substrate 101 and the second substrate 102 in one direction of the first substrate 101 and the second substrate 102. That is, when the halogen lamp 121 irradiates light to a whole section area of the first substrate 101 and the second substrate 102 in a transversal direction of the first substrate 101 and the second substrate 102, as in FIG. 1, the length of the halogen lamp 121 may be the same as, or longer than, the transversal length of the first substrate 101 and the second substrate 102. In addition, when the halogen lamp 121 irradiates light to a whole section area of the first substrate 101 and the second substrate 102 in a longitudinal direction of the first substrate 101 and the second substrate 102, the length of the halogen lamp 121 may be the same as, or longer than, the longitudinal length of the first substrate 101 and the second substrate 102.

While irradiating light to whole section areas of the first substrate 101 and the second substrate 102 in one direction X of the first substrate 101 and the second substrate 102 and moving in a direction Y crossing the one direction X, the halogen lamp 121 irradiates light to the attachment member 103. While irradiating light to whole section areas of the first substrate 101 and the second substrate 102 in one direction X of the first substrate 101 and the second substrate 102 and moving in the direction Y perpendicular to the one direction X, the halogen lamp 121 may irradiate light to the attachment member 103. While described as the light source 120 moving, it is understood that the stage 110 could move in addition to or instead of the light source 120 so as to induce relative motion between the light source 120 and substrates 101, 102.

Figure 3:
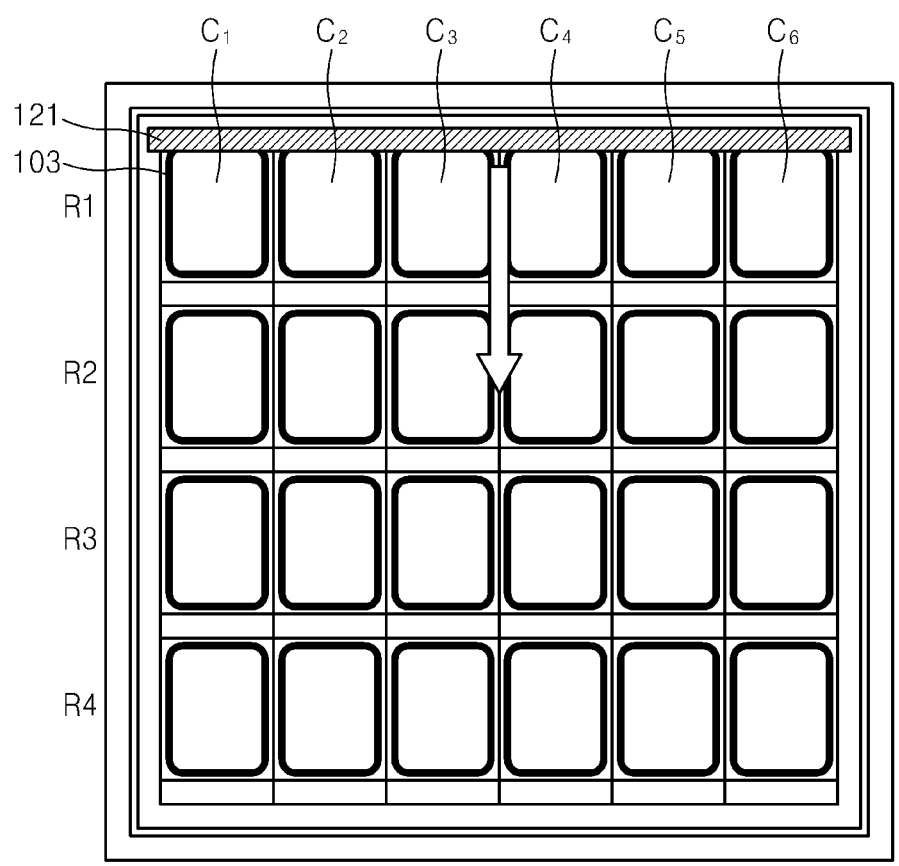
FIG. 3 is a plan view schematically illustrating the sealing apparatus of FIG. 1.

FIG. 3 is a plan view schematically illustrating the sealing apparatus 100 of FIG. 1. Referring to FIG. 3, the shown halogen lamp 121 is disposed to irradiate light to a whole section area of the first substrate 101 and the second substrate 102 in a transversal direction of the first substrate 101 and the second substrate 102 (i.e., along direction X). That is, the halogen lamp 121 simultaneously irradiates light to the attachment member 103 of cells C1 through C6 disposed in a traversal row R1 on the first substrate 101. While simultaneously irradiating light to the attachment member 103 of the cells C1 through C6 disposed in the same row, and moving in the direction Y perpendicular to the transversal direction X in which the halogen lamp 121 is disposed, the halogen lamp 121 irradiates light to the attachment member 103 of the cells C1 through C6.

Figure 4:
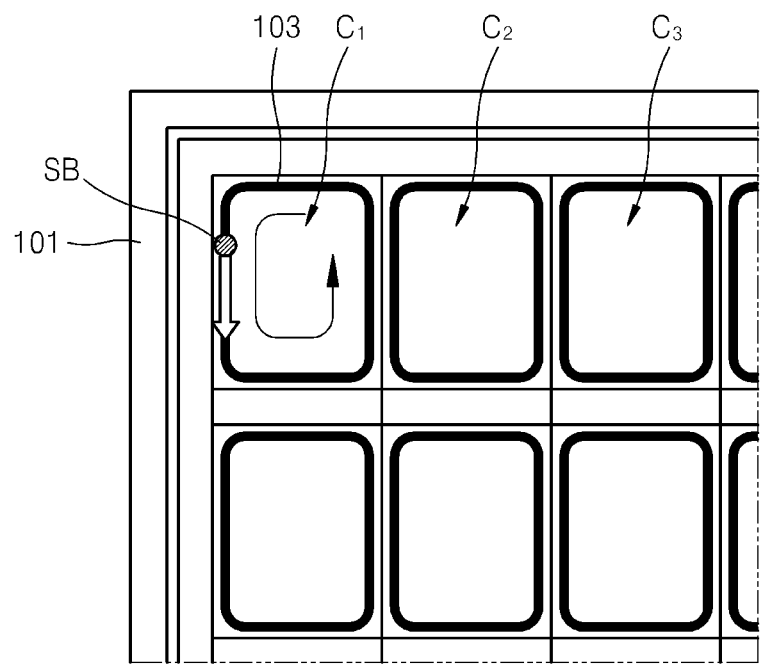
FIG. 4 is a diagram for explaining a method of sealing a display device using a conventional laser sealing apparatus.

FIG. 4 is a diagram for explaining a method of sealing a display device using a laser sealing apparatus. Referring to FIG. 4, the laser sealing apparatus irradiates a laser spot beam SB to an attachment member 103 surrounding one cell C1 of the cells in a clockwise direction or a counterclockwise direction to melt the attachment member 103, then moves to an adjacent cell C2 and irradiates the laser spot beam SB to the attachment member 103 surrounding the cell C2 to melt the attachment member 103. Thus, since each of the cells is irradiated one by one with the laser spot beam SB, different stresses due to differences in thermal expansion are developed in a boundary area between the cell C1 irradiated with the laser spot beam SB and the cell C2 that is adjacent to the cell C1 and is not irradiated with the laser spot beam SB. The stress differences may cause one or more micro-cracks between the cells C1 and C2. Accordingly, there is a problem in which crack defects occur mainly at burrs formed during a process of cutting out a substrate.

Figure 5A:
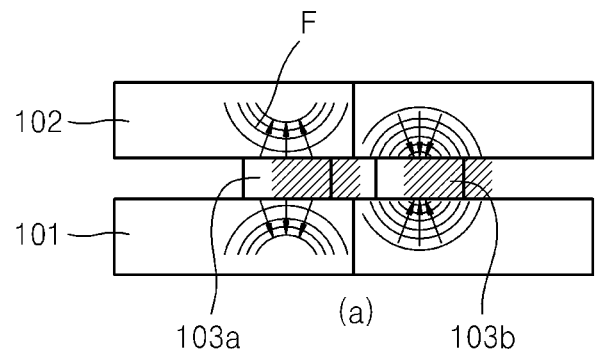
FIG. 5A is a cross-section view schematically illustrating a distribution of difference between stresses occurring in cells and FIG. 5B is a cross-section view schematically illustrating a crack between cells.
Figure 5B:
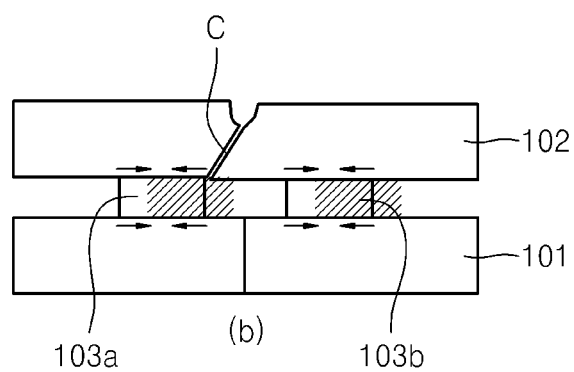

FIG. 5A is a cross-section view schematically illustrating a distribution of stress differences occurring in cells and FIG. 5B is a cross-section view schematically illustrating a crack C between cells using the laser sealing apparatus of FIG. 4. Referring to FIG. 5A, differences between stresses is developed between an attachment member 103$a$ irradiated with a laser beam and an attachment member 103$b$ not irradiated with a laser beam due to temperature differences. As shown in FIG. 5B, the crack C may occur at areas of a first substrate 101 and a second substrate 102 between the attachment members 103$a$ and 103$b$ due to the stress difference.

However, since the sealing apparatus 100, according to an embodiment of the present invention, irradiates light to a whole section area of the cells C1 through C6 arrayed in one direction of the first and second substrates 101 and 102, the stress differences occurring between the cells C1 through C6 may be minimized. Accordingly, a breaking defect of a cutting surface that occurs during a process of cutting out each of the cells C1 through C6 may be prevented. The halogen lamp 121 may output about 2 to about 10 KW.

As shown in FIG. 2, the reflector 122 is disposed over the halogen lamp 121, and can reflect and converge the light radiated from the halogen lamp 121 toward the attachment member 103. Although the reflector 122 may have one of various shapes depending on the shape of the halogen lamp 121, the reflector 122 may be formed with a concave shape with respect to the cylindrical halogen lamp 121, as shown in FIG. 1. The reflector 122 may be formed with the same length as or a length longer than that of the halogen lamp 121. Moreover, while the reflector 122 is shown, it is understood that other focusing elements (such as a lens) can be used in addition to or instead of the reflector 122.

While not required in all aspects, the light-blocking member 140 is seated on the second substrate 102. The light-blocking member 140 allows light irradiated from the halogen lamp 121 to pass therethrough to the attachment member 103 and prevents light to pass therethrough to areas at which the attachment member 103 is not coated. A light-emitting unit 104, as shown in FIG. 2, is in each of the cells C1 through C6. Since the light irradiated from the halogen lamp 121 is at a temperature high enough to melt the attachment member 103, the light-emitting unit 104 may deteriorate when the light is irradiated to the light-emitting unit 104. Therefore, the light-blocking member 140 serves to allow light irradiated from the halogen lamp 121 to be irradiated to the attachment member 103, and to not allow light to be irradiated to the light-emitting unit 104. The light-blocking member 140 is patterned to allow light to the attachment member 103 and to block light at the light at the light emitting units 104. Thus, light irradiated from the halogen lamp 121 is irradiated to the attachment member 103 and not to the light-emitting unit 104, therefore the light-emitting unit 104 may be protected from the light.

While not required in all aspects, the shown light-blocking member 140 is disposed spaced apart from the second substrate 102. That is, a predetermined gap t, as shown in FIG. 2, exists between the light-blocking member 140 and the second substrate 102. Since the light-blocking member 140 is subjected to light irradiated from the halogen lamp 121 and a temperature thereof rises, if the light-blocking member 140 is disposed close to the second substrate 102, the thermal energy of the light-blocking member 140 is transferred to the first and second substrates 101 and 102 and may affect the light-emitting unit 104. Therefore, in the shown embodiment of the present invention, the predetermined gap t is maintained between the light-blocking member 140 and the second substrate 102 to prevent the thermal energy from being transferred from the light-blocking member 140 to the light-emitting unit 104 and to cool the light-blocking member 140 by air that flows in the gap t. While shown as a gap filled with air or other gases, it is understood that a thermally insulating layer can be disposed within the gap. Moreover, the gap can be a vacuum.

While not required in all aspects, the reflecting plate 150, as shown in FIGS. 1 and 2, is disposed between the first substrate 101 and the stage 110. The reflecting plate 150 reflects light that passes through the light-blocking member 140 and the first and second substrates 101 and 102 to prevent the stage 110 from being heated by the light.

Hereinafter, a method of manufacturing a flat display device according to an embodiment of the present invention will be described. A first substrate 101 and a second substrate 102 are prepared. Light-emitting units 104 are disposed on the first substrate 101 and an attachment member 103 is disposed on the second substrate 102.

Next, the first substrate 101 and the second substrate 102 are attached to each other. When the first substrate 101 and the second substrate 102 are attached to each other, the attachment member 103 surrounds the light-emitting unit 104.

Subsequently, the attached first and second substrates 101 and 102 are seated on a stage 110 of a sealing apparatus 100. The stage 110 fixes the first and second substrates 101 and 102 while a halogen lamp 121 irradiates light.

After the first and second substrates 101 and 102 are seated on the stage 110, light from the halogen lamp 121 is irradiated to the attachment member 103 in a manner so that the light is simultaneously irradiated to a whole section area of the attachment member 103 in one direction of the first and second substrates 101 and 102. The halogen lamp 121 irradiates light to a whole section area of the first substrate 101 and the second substrate 102 in the one direction of the first and second substrates 101 and 102. As shown in FIG. 3, the halogen lamp 121 may irradiate light to a whole section area of the first and second substrates 101 and 102 in a transversal direction X at the same time.

While the halogen lamp 121 irradiates light to whole section areas of the first and second substrates 101 and 102 in the one direction, and moves in a direction perpendicular to the above-mentioned direction, the halogen lamp 121 irradiates light to the attachment member 103. When the halogen lamp 121 irradiates light to whole section areas of the first substrate 101 and second substrate 102 in the transversal direction X, the halogen lamp 121 may irradiate light to the attachment member 103 while moving in the longitudinal direction Y perpendicular to the transversal direction X.

The attachment member 103 irradiated with the light is melted and hardened so as to attach the first substrate 101 and the second substrate 102 to each other.

The light irradiated from the halogen lamp 121 is reflected and converged by a reflector 122, and is irradiated to the attachment member 103.

While not required in all aspects, the light irradiated from the halogen lamp 121 passes through the light-block member 140 to areas coated with the attachment member 103, and does not pass through the light-block member 140 to areas not coated with the attachment member 103

While not restricted thereto, the attachment member 103 may be a frit material.

The above-described flat display device is construed to have first and second substrates attached to each other and a light-emitting unit disposed between the first and second substrates, and to include organic light-emitting display devices, plasma display devices or the like. In addition, the above-described flat display device is construed to include liquid crystal display devices, however, aspects of the present invention are not limited thereto.

Since the above-described sealing apparatus of aspects of the present invention simultaneously irradiates light to attachment member of cells disposed on a substrate in a row, and melts the attachment member, the occurrence of cracks due to different stresses between the cells can be prevented.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of manufacturing a flat display device using a sealing apparatus that attaches a first substrate and a second substrate with an attachment member and has a halogen lamp, the method comprising:
   disposing the attachment member between the first substrate and the second substrate;
   attaching the first substrate and the second substrate to each other;
   seating the attached first substrate and second substrate on a stage of the sealing apparatus;
   converging the light irradiated from the halogen lamp onto the attachment member in a manner that the light is irradiated to the attachment member in a whole section area of the first substrate and the second substrate in one direction along a surface of the second substrate at the same time;
   irradiating light to the attachment member while moving the halogen lamp in a direction crossing the one direction; and
   hardening the attachment member melted by the irradiated light to attach the first substrate and the second substrate to each other,
   wherein the light is irradiated to the attachment member while the light passing through the first substrate and the second substrate is reflected by a reflecting plate disposed between the first substrate and the stage.

2. The method of manufacturing the flat display device of claim 1, wherein in the converging the light irradiated from the halogen lamp and the irradiating the light onto the attachment member, the light is reflected and converged by a reflector, and is irradiated onto the attachment member.

3. The method of manufacturing the flat display device of claim 1, wherein in the converging the light irradiated from the halogen lamp and irradiating the light to the attachment member, the one direction along a surface of the second substrate is a lengthwise direction of a side of the second substrate.

4. The method of manufacturing the flat display device of claim 1, wherein the irradiating light to the attachment member while moving the halogen lamp in a direction crossing the one direction is irradiating light to the attachment member while moving the halogen lamp in a direction perpendicular to the one direction.

5. The method of manufacturing the flat display device of claim 1, wherein the attachment member is composed of a frit material.

6. The method of manufacturing the flat display device of claim 1, further comprising disposing a light-blocking member on the second substrate, the light-blocking member allowing light irradiated from the halogen lamp to pass therethrough to the attachment member, and not allowing light to pass therethrough to areas not coated with the attachment member, between the seating the first substrate and the second substrate that are attached to each other on a stage of the sealing apparatus and the converging the light irradiated from the halogen lamp and irradiating the light to the attachment member.

7. The method of manufacturing the flat display device of claim 6, wherein the light-blocking member is disposed apart from the second substrate by a predetermined gap.

8. The method of manufacturing the flat display device of claim 1, wherein an output power of the halogen lamp is about 2 to 10 KW.

\* \* \* \* \*